United States Patent [19]
Merritt

[11] Patent Number: 5,970,719
[45] Date of Patent: Oct. 26, 1999

[54] HEATING AND COOLING DEVICE

[76] Inventor: Thomas Merritt, 1895 NE. 147th St., North Miami, Fla. 33181

[21] Appl. No.: 09/040,255

[22] Filed: Mar. 2, 1998

[51] Int. Cl.[6] .................................................. F25B 21/02
[52] U.S. Cl. ................................ 62/3.6; 62/3.2; 62/457.9
[58] Field of Search ............................. 62/3.2, 3.6, 457.9

[56] References Cited

U.S. PATENT DOCUMENTS

| | | | |
|---|---|---|---|
| 3,480,015 | 11/1969 | Gonzalez | 128/276 |
| 3,500,649 | 3/1970 | Feldman | 62/3 |
| 4,671,070 | 6/1987 | Rudick | 62/3 |
| 5,029,445 | 7/1991 | Higgins | 62/3.2 |
| 5,572,872 | 11/1996 | Hlavacek | 62/3.6 |
| 5,720,171 | 2/1998 | Osterhoff et al. | 62/3.6 |

*Primary Examiner*—Henry Bennett
*Assistant Examiner*—Mark Shulman

*Attorney, Agent, or Firm*—Malloy & Malloy, P. A.

[57] ABSTRACT

A portable, self-contained heating and cooling assembly comprising at least two compartments or alternately one compartment and a heat reservoir wherein the two compartments are specifically structured to concurrently hold containerized liquids, medical items or objects, foodstuffs, etc. Thermoelectric heat transfer technology is utilized to transfer heat energy between the two compartments by means of a thermoelectric device which, when electrically activated, serves to remove heat from one compartment and the object or substance therein and transfer such heat to the other compartment as well as the object or substance therein thereby serving to simultaneously cool the interior of one compartment and heat the interior of the other compartment. Operative modifications include the selective heating or cooling of a single object or substance within one compartment which may be interconnected in thermal contact with a second compartment or with the thermal reservoir.

18 Claims, 9 Drawing Sheets

HEATING AND COOLING DEVICE

BACKGROUND OF THE INVENTION

1. Field of the Invention

This invention relates to a compact and portable device designed to heat and/or cool a variety of containerized liquids, food stuffs, medical devices, etc. The present invention is directed towards such a device which utilizes thermoelectric heat transfer technology wherein two or more objects or substances may be concurrently heated and cooled by transferring heat from one of the objects. (thereby cooling it) to another object (thereby heating it). Alternatively, the present invention may be utilized to independently heat or cool an object through the use of a heat reservoir to which heat may be transferred or from which heat may be removed.

2. Description of the Related Art

The portable heating or cooling of a variety of items including liquids, food stuffs, medical items, etc. has traditionally relied on systems that exchange thermal energy with the environment. This is particularly true of devices for heating or cooling containerized liquids such as baby formula in standard baby bottles. For newborn infants, baby formula is most readily accepted if it is close to body temperature as would be natural mother's milk. For older children, not yet weaned, cooled formulas are often in order depending upon the temperature of the environment. In today's society, parents are often on the go with their children. Hence, a portable means of either warming or cooling baby formula as well as other substances is a welcome convenience for many parents. Varying degrees of portability are demonstrated in known heating or cooling devices but none disclose a thermally-closed system that does not exchange thermal energy with the environment, which would essentially offer an ability to be stored anywhere without the problems associated with an external heat exchanging surface. Further, for devices having external heat exchanging surfaces, physical discomfort can arise from having to hold such a device. Condensation on cold surfaces can be problematic and external heat exchanging surfaces must be convecting as conducting thermal energy even when the device is stored.

A variety of substantially portable devices are known to be directed to the heating of baby bottles and the like. Such devices include a flexible heating pad that surrounds a baby bottle that can be powered by connecting an adaptor structure to an automobile cigarette lighter. Also known is a manually portable refrigerating and heating unit for cooling and/or heating a multiplicity of baby bottles that includes a temperature control facility. It is also known to provide a baby bottle or like container with electrical heating elements embedded within the wall thereof, with a thermostat controlling the current to the bottle or like container from an accompanying rechargeable battery system.

Generally speaking, conventional self-contained means of heating or cooling containerized liquids provide either limited duration performance or are inconvenient. An example of such a self-contained system includes the cooling of liquids in a baby bottle by means of a pre-sealed tube of frozen non-toxic liquid that is inserted into the baby bottle. Similarly, a cooling vessel for beverages includes inner and outer walls that form a refrigerant compartment that is filled with a chilled liquid for cooling of the beverage enclosed within the inner wall.

The obvious disadvantages present in devices of the type set forth above have resulted in attempts to develop more compact and efficient devices for heating and/or cooling a variety of objects and substances. Such attempts have involved the use of compact, and electrically-driven means of transferring heat. However, such devices are somewhat limited for use in applications involving limited heat capacity and small volumes. For example, one attempt involves a cooling or warming compartment that uses thermoelectric heat transport but requires a ventilation system to reduce cool or hot spots within the compartment. Similarly, another such known device involves a thermoelectric apparatus for heating or cooling food and drink containers which must be equipped with a blower/heat exchanger.

Based on the above, there is a need in the art for a heating and cooling device that transfers heat from one object to another object to effect concurrent cooling and heating of the objects, respectively. Any such heating and cooling device would preferably incorporate the use of thermoelectric heating and cooling facilities to transfer and/or pump heat from a first containerized substance to a second containerized substance. In addition, any such heating and cooling device would preferably be structured to achieve cooling and heating with little or no net heat flux exchange with the external environment, and further, would provide a compact, self-contained, continuous means of cooling and heating liquids which is not constrained by the humidity and temperature conditions of the external environment. By providing such a device which does not require heat exchange with the environment, the result would be a device that offers convenient portability, allowing the device to be stowed in luggage, to be carried on one's person, in a bag or pack, or to be hand-carried. Finally, when cooling liquids, it is especially important to provide a good thermal sink for removal of rejected heat. Therefore, it would be ideal to provide an invention which overcomes many of the disadvantages associated with known heating and cooling devices and which incorporates the use of a self-contained liquid heat sink in the form of the liquid filled container that is to be heated. Accordingly, the present invention is preferably structured to concurrently cool and heat separate liquid filled containers, and in general, to meet the needs which remain in the art.

SUMMARY OF THE INVENTION

The present invention is directed to an efficient, portable device, having a variety of embodiments designed to heat and cool various substances or items. In a first embodiment, two objects may be simultaneously cooled and heated by transferring heat from one object (thereby cooling it), to another object (thereby heating it). Separate containerized liquids can be conveniently heated and cooled, simultaneously, as well as other objects such as foodstuffs, medical items, etc. In an alternate embodiment, items may be heated alone, or cooled alone, depending on the needs of the user. In yet another embodiment, the present invention includes an insulated thermal reservoir from which heat is extracted for warming an object or into which heat can be pumped for cooling an object.

In order to clearly understand a description of the structural components as well as the workings and method of operation of the subject invention, certain specified terms are used herein. The term "thermoelectric device" used herein refers to a device that transfers or "pumps" heat under the application of electrical power by means of the known PELTIER EFFECT. The term "thermal conductors" refers to any number of structures for directly interconnecting or contacting articles that are to be cooled or heated within thermally insulated compartments of the various embodiments of the present invention for purposes of transferring heat energy therebetween. The term "thermal reservoir" refers to any one of a variety of different facilities for storing heat or maintaining a volume of diminished heat (i.e., a cold volume). In one preferred embodiment to be described hereinafter, a thermally insulated compartment containing a heat capacity material such as metal or water is used for this purpose. The thermal reservoir is used either to supply heat to or accept heat from an object or substance that is to be heated or cooled, respectively. As will be more apparent through an understanding of a detailed description of a related embodiment of the subject invention, an object or a substance can be selectively heated or cooled without the exchange of heat energy with the environment.

Accordingly, a preferred embodiment of the present invention comprises a substantially self-contained unit or container having two compartments disposed in adjacent relation to one another. Each of the compartments has a hollow configuration dimensioned and configured to receive a container or like object to be heated or cooled. The interior of each compartment is further defined by a liner formed of a thermally conductive material such as metal or the like which may have a variety of different structural configurations so as to facilitate physical contact with the bottle or container placed within the various compartments and thereby, more efficiently transferring heat energy between the bottles or like containers within the compartments and the liners of such compartments.

Important to the various embodiments of the present invention is the provision of one or more thermoelectric (hereinafter "TE") devices. By way of background, one such TE device or module was utilized in my invention for a thermoelectric hair dryer, as described in my U.S. Pat. No. 5,507,103, incorporated herein by reference. The TE device of the present invention is preferably manufactured using two thin ceramic wafers with a series of "P" and "N" doped semi-conductor blocks sandwiched therebetween. The "P" and "N" type semi-conductor blocks are electrically interconnected along one face of one of the ceramic wafers wherein, depending upon the polarity and upon electrical activation, heat is transferred from one of the external ceramic wafers to the other external ceramic wafer thereby defining one hot face and one cold face. In the aforementioned preferred embodiment, the TE device is physically interconnected in heat transferring engagement with both liners of the adjacently positioned compartments. Accordingly, upon activation of the TE device, heat will be absorbed from one of the compartments and transferred through the TE device to the other of the two compartments thereby serving respectively to cool any object or substance within one of the compartments and concurrently heat the object or substance within the other of the two adjacently positioned compartments.

Proper insulation of the compartments, in the various embodiments of the present invention is an important factor in efficiently transferring heat energy between the compartments and in the maintenance of the various compartments within preferred temperature parameters. Additional embodiments of the present invention include self contained units with a plurality of sets or pairs of compartments wherein each set or pair includes both a heating compartment and a cooling compartment interconnected in heat transferring relation through the provision of one or more TE devices of the type set forth above. Yet another embodiment of the present invention incorporates the use of a single compartment in which an object or substance may be placed for selective heating or cooling thereof. In that embodiment, the one compartment is interconnected in heat conducting or transferring relation with a heat reservoir which, as set forth above, may take a variety of structural configurations and which is interconnected with one or more TE devices so as to either have heat transferred thereto or have heat energy removed therefrom.

As set forth above, the one or more TE devices used in the various embodiments of the present invention will generally have to first be electrically activated in order to accomplish the aforementioned transfer of heat energy. Power sources used in the various portable, self-contained structural embodiments of the present invention may include replaceable or rechargeable batteries. Alternatively, the power source may be defined by several solar power cells used either as a direct power source for activating the TE device or alternately as a source of power to recharge batteries.

Also, the various embodiments of the present invention may incorporate structure for thermally sensing temperatures within the various heating or cooling compartments. These compartments may be temperature controlled by adjusting the flow of electrical current to the thermoelectric device, based on signals received from thermal-sensing circuitry associated with the various heating or cooling compartments.

Accordingly, a primary object of the present invention is to use thermoelectric heat transferring technology to transfer heat extracted from one object to another object resulting in the simultaneous heating of one object and cooling of the other.

Another primary object of the present invention is to provide an efficient, portable and substantially self-contained unit for conveniently and concurrently heating and cooling two separate containerized liquids or like substances in a manner which avoids the need for conventional heat exchangers.

Another important object of the present invention is the provision of a self-contained unit for selectively heating or cooling a containerized liquid, substance or other object without the exchange of heat energy with the environment.

Still another important object of the present invention is to provide a self-contained unit for concurrently heating and cooling a variety of objects or substances in a continuous manner and for maintaining the heated or cooled objects or substances within preferred, predetermined temperature ranges for extended periods.

Yet another important object of the present invention is to provide a self-contained heating and cooling device that takes advantage of the increased thermal gradients achievable through the use of a plurality of TE devices connected to one another in thermal series.

Still another important object of the present invention is to provide a plurality of heating and cooling containers thermally interconnected with one another for heat transfer therebetween so as to simultaneously heat and cool a large number or multiples of a variety of items and/or substances.

Another important object of the present invention is to provide a self-contained, heating and cooling device structured to include sufficient versatility to use one of a plurality of compartments to either heat or cool or alternately to use one compartment in combination with a thermal reservoir to accomplish selective heating or cooling of any one of a variety of items or substances, as desired.

These and other objects will become apparent upon reviewing the following detailed description and recited claims.

BRIEF DESCRIPTION OF THE DRAWINGS

For a fuller understanding of the nature of the present invention, reference should be had to the following detailed description taken in connection with the accompanying drawings in which:

FIG. 1b is an enlarged, partial cutaway view of a portion of the component illustrated in FIG. 1a.

FIG. 2b is a perspective view in partial cutaway illustrating the preferred structural components utilized in the embodiment of the invention shown in FIG. 2a.

FIG. 2c is a front view in partial section of the embodiment of FIG. 2a.

Like reference numerals refer to like parts throughout the several views of the drawings.

DETAILED DESCRIPTION OF THE PREFERRED EMBODIMENTS

Figure 1A:
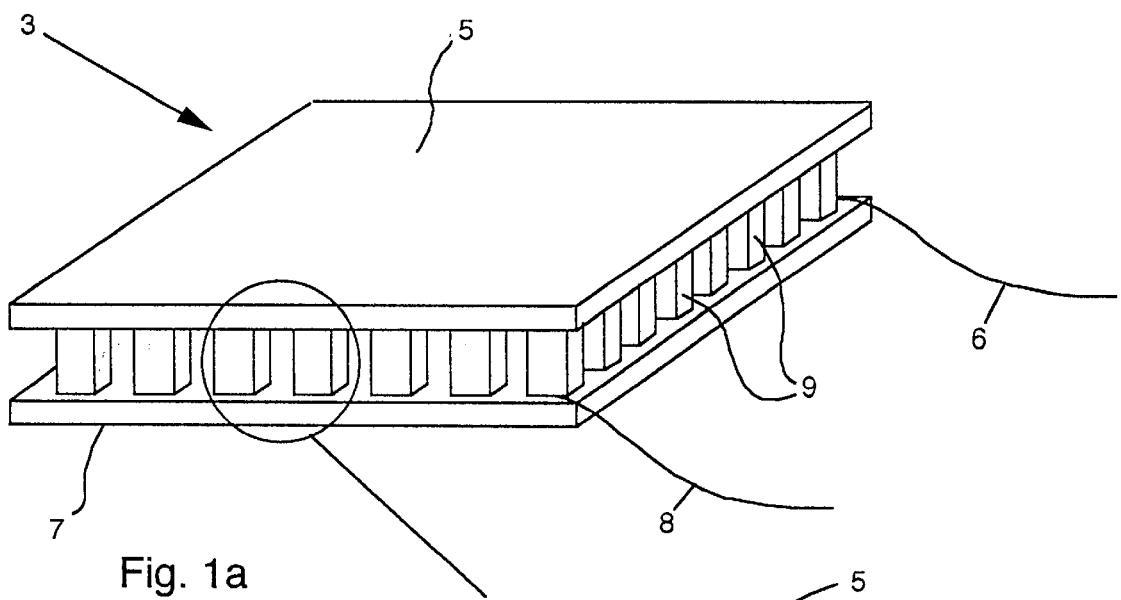
FIG. 1a is a perspective view of a preferred structural component of the present invention, namely a thermoelectric (TE) device or module.
Figure 1B:
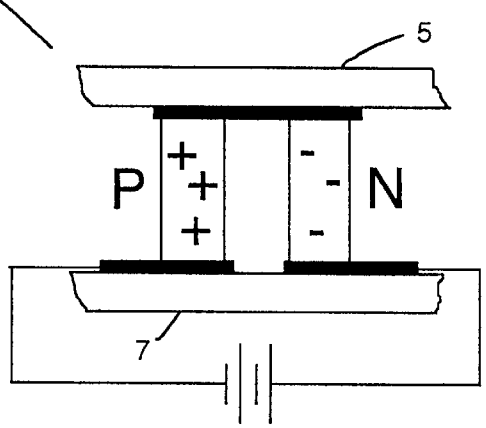

Referring initially to FIGS 1a and 1b, a preferred structural component, namely, a thermoelectric (TE) device 3, used in the present invention will be described. The TE device preferably comprises two thin ceramic wafers 5 and 7 with a series of bismuth telluride semi-conductor blocks 9 sandwiched between them which are sufficiently doped to exhibit an excess of electrons (P) or a deficiency of electrons (N). The ceramic wafer material provides an electrically-insulated and mechanically rigid support structure for the TE device. Adjacent P and N type semi-conductor blocks are electrically connected together at one face of the device, as depicted in FIG. 1b. The inner surfaces of wafers 5 and 7 provide printed circuit interconnects among all the semi-conductor blocks. External electrical connection to this circuitry is preferably provided by leads 6 and 8 shown in FIG. 1a. It is at the P-N junctions of adjacent semi-conductor blocks that, by the PELTIER EFFECT, heat is absorbed from a face or surface formed by the wafer, in this instance, face 5. Electrical current conducts this heat to the other face of the device, namely wafer 7. Hence, the application of a given polarity of voltage across the TE device causes one face of the device to become hot and the other face to become cool. Upon reversal of the polarity, the identity of the hot and cold faces reverses as well.

As has been described with reference to FIG. 1a, the face or wafer 7 of the TE device is made hot, which occurs by two mechanisms, first, the heat of electrical dissipation of the device (that is, the internal electrical heat of the device) and, second, the heat extracted from the environment that is "pumped", or transferred, from the cold face or wafer 5 to the hot face or wafer 7. By contrast, the cold face 5 of the TE device is made cold by one mechanism, the "pumping" of the heat from the cold face to the hot face. As a result, more heat energy is emanated from the hot face 7 of the wafer than is absorbed by the cold face 5 because the ambient heat surrounding the cold face is added to the electrically created heat internal to the TE device. Hence, a larger thermal mass is required for heat sinking in cooling applications than is required for the heat source in heating applications.

Figure 2A:
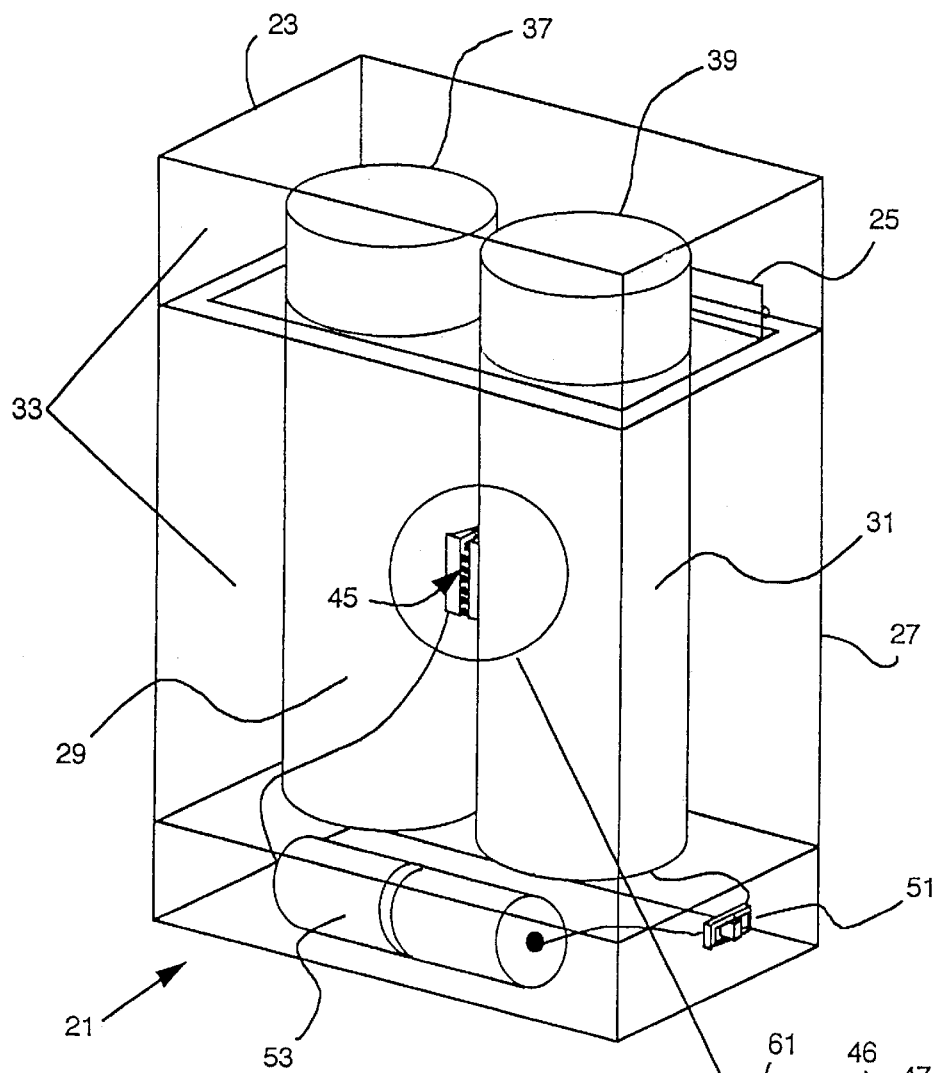
FIG. 2a is a perspective view of one preferred embodiment of the present invention.
Figure 2B:
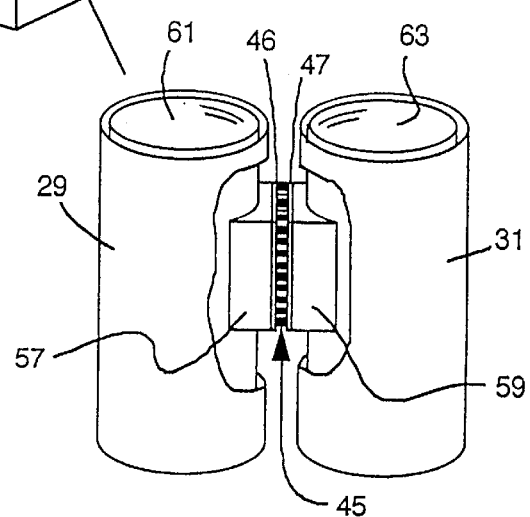

Referring now to FIG. 2a, one preferred embodiment of the present invention is illustrated and generally indicated as 21. More specifically, a two-compartment heater/cooler 21 is provided, preferably with an insulated lid 23, and is designed to simultaneously heat and cool liquids held within containers such as a baby bottle, and/or food substances, medicines or other items. Hinge 25 is indicative of one of several ways the lid 23 can be attached to the body 27 of the heater/cooler 21. Alternatively, the lid 23 could be press fit or snap fit onto the body 27. Preferably, insulation 33 fills the volume surrounding a first compartment 29, a second compartment 31, and the volume within the lid 23 that is not occupied by compartment extensions 37 and 39. Compartments 29 and 31 are respectively lined with a heat-exchanging, thermally-conductive material 61 and 63, such as thin metal, in contact with respectively positioned thermally conductive heat exchangers 57 and 59 positioned in contact with the TE module 45 as shown in FIG. 2b. The interior surface of these liners can have corrugated construction, spring protrusions, or spring-loaded surfaces so as to improve thermal contact with objects placed within the respective compartment. Upon typical use of the invention, a container of liquid, for instance, a soda can or baby bottle holding juice is placed in compartment 29 and a separate container of liquid, for instance, a baby bottle holding infant formula is placed in compartment 31. A switch 51, shown in FIG. 2a, closes an electrical circuit including a battery supply 53 (either rechargeable or non-rechargeable) and the TE device 45, causing it to be activated. This switch can be a small, spring loaded, push button variety mounted into the bottom of compartment 29 or 31. In one embodiment, the placement of a baby bottle, for instance, within the compartment would depress a protruding button of the switch and thereby activate the TE device. Alternately, the switch 51 could be placed on the outside surface of the invention, as shown in FIG. 2-A.

For purposes of discussion, it is assumed that the polarity of the applied electrical power establishes that compartment 31 is the warming compartment. Reference is made to FIG. 2b which is an enlarged detail view of the TE device 45 attached to the respective compartments 29 and 31. Upon closure of switch 51, the TE device is activated and heat is drawn from a container of liquid placed within compartment 29 in contact with the liner 61, through a thermally conductive heat exchanger structure 57, which is in contact with one face 46 of the TE device 45. That heat, combined with the Joulian heat created by the power source itself, passes through face 47 of the TE device 45 to the thermally conductive heat exchanger 59, in contact with the liner 63 of warming compartment 31. A temperature sensor, not shown in FIGS. 2A or 2B, may be placed within a compartment, and operate in concert with an electronic control circuit, as described hereinafter, to maintain the temperature in the respective compartment at a user specified value. A temperature sensor and associated control circuits can be used to maintain desired temperatures in cooling compartments, warming compartments, or both as will be described in greater detail with reference to FIG. 7.

Figure 2C:
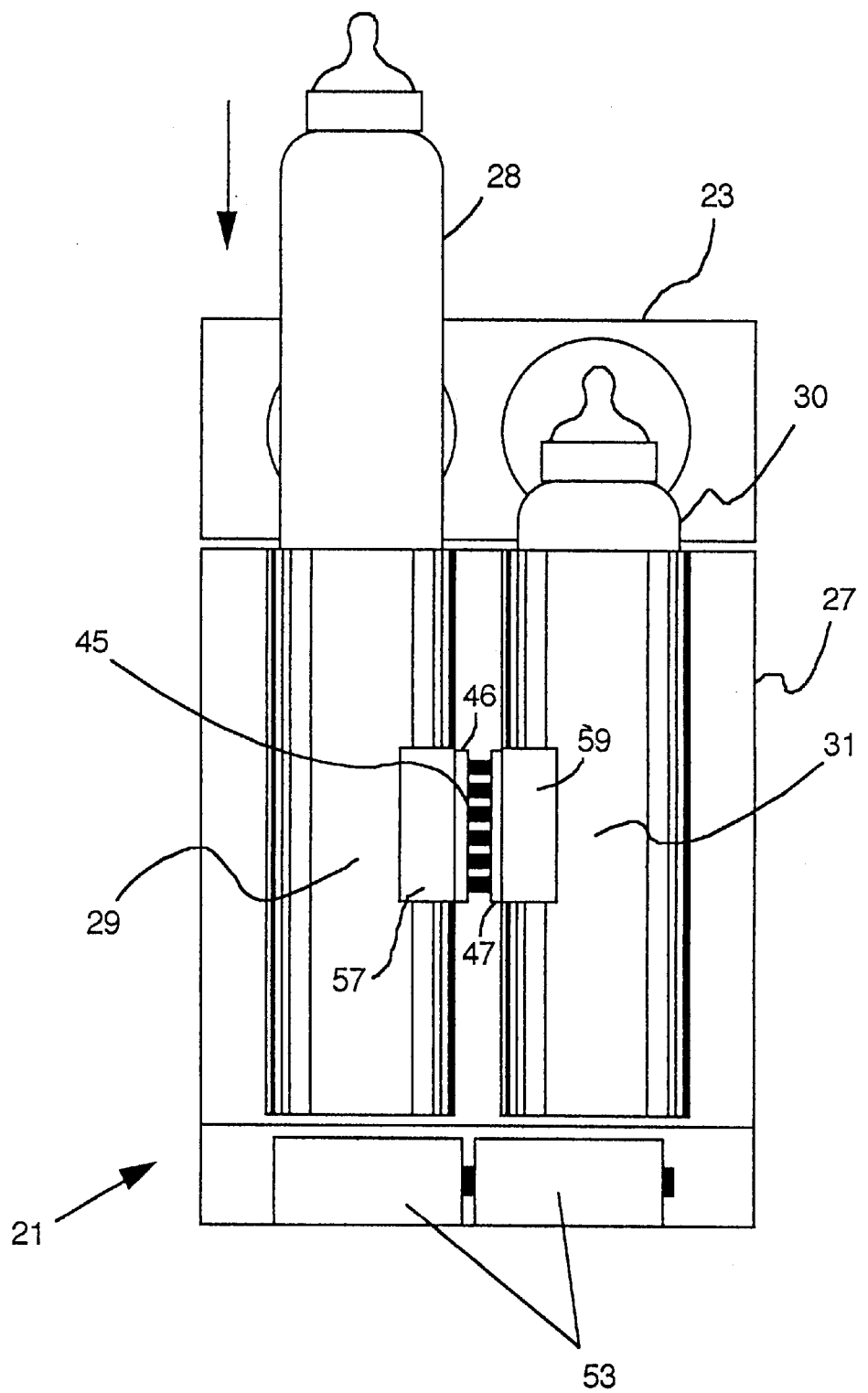

FIG. 2c is a cross-sectional view of the preferred embodiment of FIG. 2a showing the open lid 23 with placement of containers, which may be in the form of but are not at all limited to baby bottles 28 and 30, in the warming and cooling compartments 29 and 31, respectively. Also shown in FIG. 2c is the TE device 45 and a power supply in the form of batteries 53. It is noted that rechargeable batteries can be used as the power supply which may be rechargeable by an AC-to-DC adapter. Further, an AC-to-DC adapter can be used to connect the heater/cooler unit 21 to a conventional source of AC current, in lieu of batteries 53, as the primary power supply.

Figure 3:
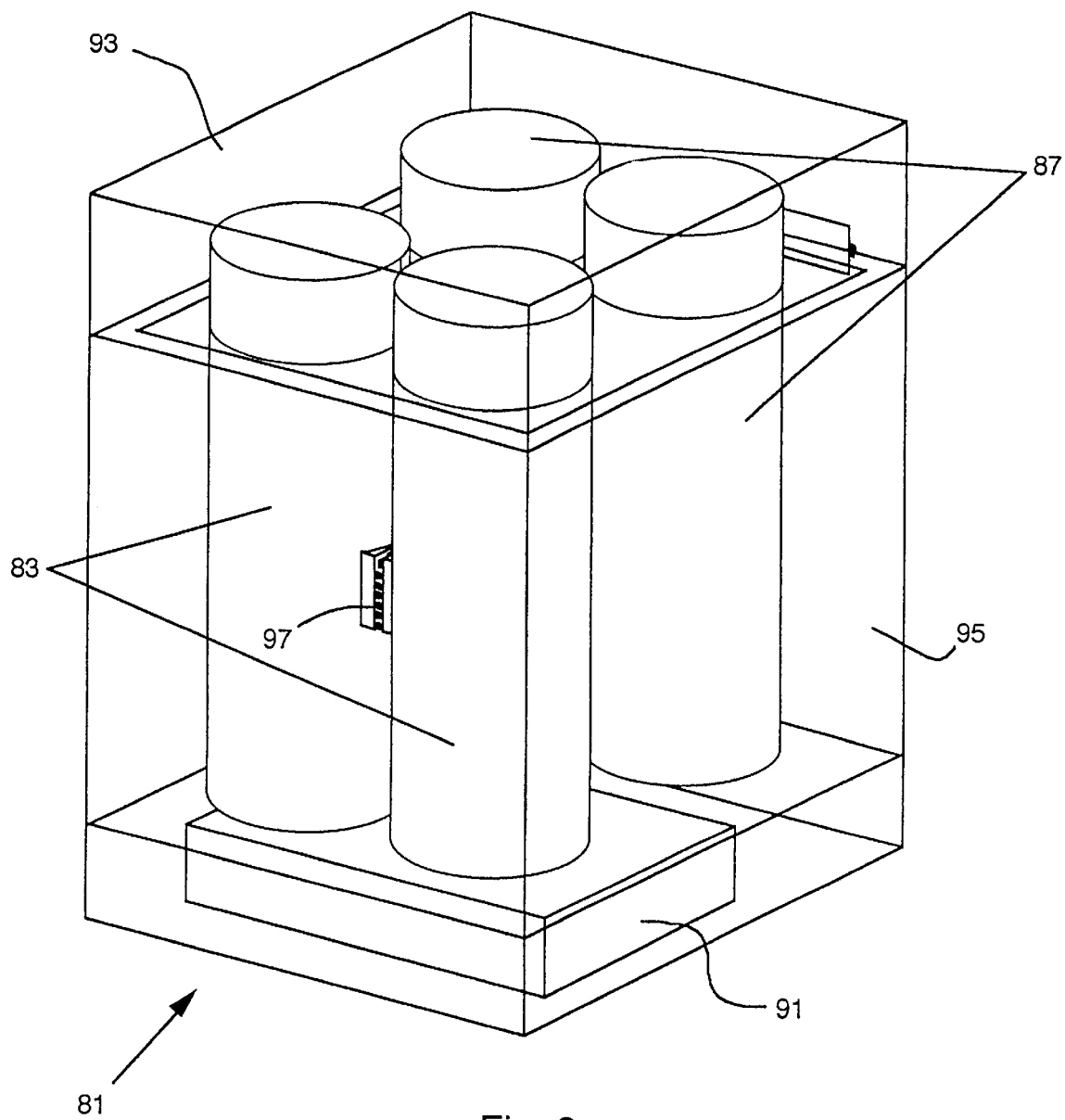
FIG. 3 is a perspective view of yet another embodiment of the present invention.

FIG. 3 depicts another preferred embodiment of the present invention which is generally indicated as 81 and includes two pairs or sets 83 and 87 of compartments wherein each set includes a heating and a cooling compartment. The TE device 97 for the set 83 of heating and cooling compartments is shown. A corresponding TE device for the set of compartments 87 is not shown but is placed similarly as the TE device 97. The container 81 of this embodiment of the present invention is also depicted with a hinged lid 93 and body 95 enclosing the two sets of compartments 83 and 87 and power supply 91. A further variation of this embodiment of the present invention containing multiple sets of compartments would include multiple warming compartments that are in thermal contact with each other and a corresponding set of multiple cooling compartments that are in thermal contact with each other. This can be achieved, for example, by providing points of common thermal contact among the various thermally conductive compartment liners. Further, such thermal contact can be provided by penetration of the compartments by metal strips that connect adjacent warming compartment liners. One or more TE devices similar to that disclosed in FIGS. 1–3 could be used to pump heat between such hot and cold sets of compartments.

Figures 4A, 4B:
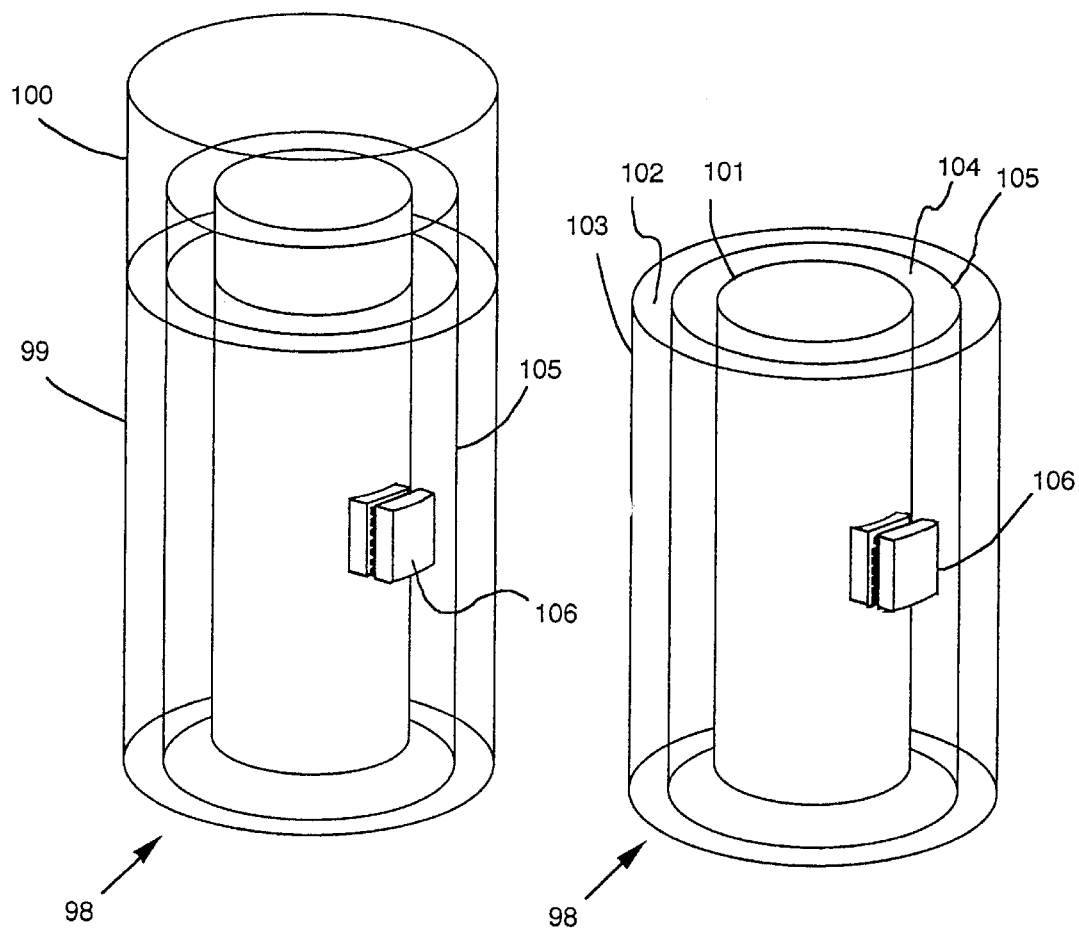
FIG. 4a is a perspective view of yet another embodiment of the present invention.
FIG. 4b is a partial perspective view of the embodiment of the invention shown in FIG. 4a, illustrating a top thereof removed.

Another embodiment of the present invention is disclosed in FIGS. 4a and 4b and provides for the cooling or heating of a single compartment by exchange of energy with a thermal reservoir. In FIG. 4a a cylindrical container generally indicated as 98 is shown having a bottom section 99 and preferably, a removable top section 100. FIG. 4b shows the device of FIG. 4a with the top section removed. An inner cylindrical compartment 101 is constructed of a thermally conductive material such as metal. Here again, the compartment is structured to contain any one of a number of different substances or articles that is to be heated or cooled. Immediately surrounding compartment 101 is a void 104 which preferably is to be filled with insulating material, such as styrofoam, as only one example. Preferably, enclosing the insulated void 104 is a cylindrical structure 105 that serves as a thermal reservoir, to which a thermoelectric (TE) device 106, having its associated electrical connections not shown, is mounted with one face of TE device 106 in thermal contact with compartment 101 and the other face in thermal contact with the thermal reservoir 105. Between the outer container 103 and the thermal reservoir 105 is a second volume 102 of insulating material. To cool compartment 101 and any article or substance contained therein, heat can be pumped from the compartment 101 to thermal reservoir 105. Conversely, to heat compartment 101 reversal of current through thermoelectric device 106 will cause heat to be pumped from thermal reservoir 105 to compartment 101. The thermal reservoir 105 may be defined or structured as a small thin cylindrical, metal structure. An alternate form of such a thermal reservoir can include a volume of liquid such as water contained in a thermally conductive shell, although a number of alternate forms are viable, including variations in the geometry and further including a thermal reservoir that is adjacent to but not concentric with the compartment 101. In fact, a second compartment as depicted in FIG. 2a can house a thermal reservoir rather than a second article to be heated or cooled. The thermal reservoir for this variation of the subject embodiment could be either removably or permanently mounted within one of the compartments 29 or 31.

Figure 5:
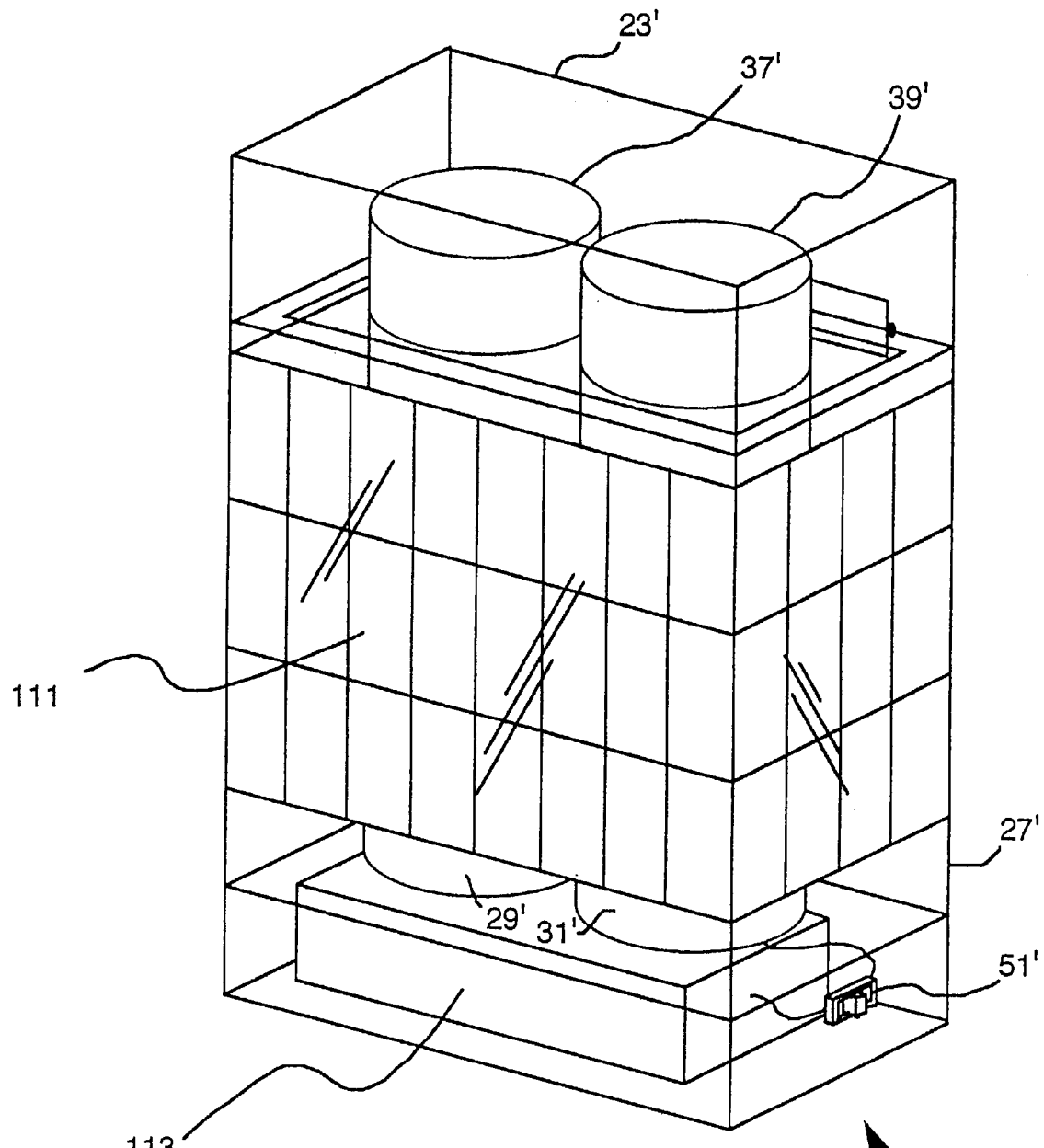
FIG. 5 is a perspective view of yet another embodiment of the present invention.

Yet another embodiment of the present invention, is shown in FIG. 5, and relates to a self-contained heating/cooling unit generally indicated as 115. The unit 115 is similar in structure to the embodiment of FIG. 2a, generally represented as 21 with the addition of a solar activated power source. More specifically, solar cells ill preferably formed from amorphous silicon solar cells mounted on flexible substrates are particularly suited and are disposed in somewhat surrounding relation but in an exposed orientation relative to the exterior of the container having the enclosing bottom portion 27' and the removable lid 23'. As with the embodiment of FIG. 2a, two adjacently positioned containers 29' and 31' are disposed in thermal contact with one another through the provision of a TE device (not shown in FIG. 5) being generally of the type described above with reference to FIGS. 2a and 2b. The embodiment of FIG. 5 may include a power module, as at 113, which may be activated by a manually controlled, exteriorly accessible switch 51'. Preferably, the power module 113 can assume at least two different embodiments. In a first embodiment, the power module 113 contains a battery charging circuit as well as rechargeable batteries that provide electrical current to the TE device. The recharging electrical circuit receives power from the solar cells 111 for purposes of subsequently recharging the batteries. In a second embodiment of the structure shown in FIG. 5, the main function of the power module 113 is to condition the power received from solar cells 111 for energizing the TE device directly. An example of such "power conditioning" is modifying the voltage and/or current from the solar cells 111 for utilization directly by the TE device.

Figure 6:
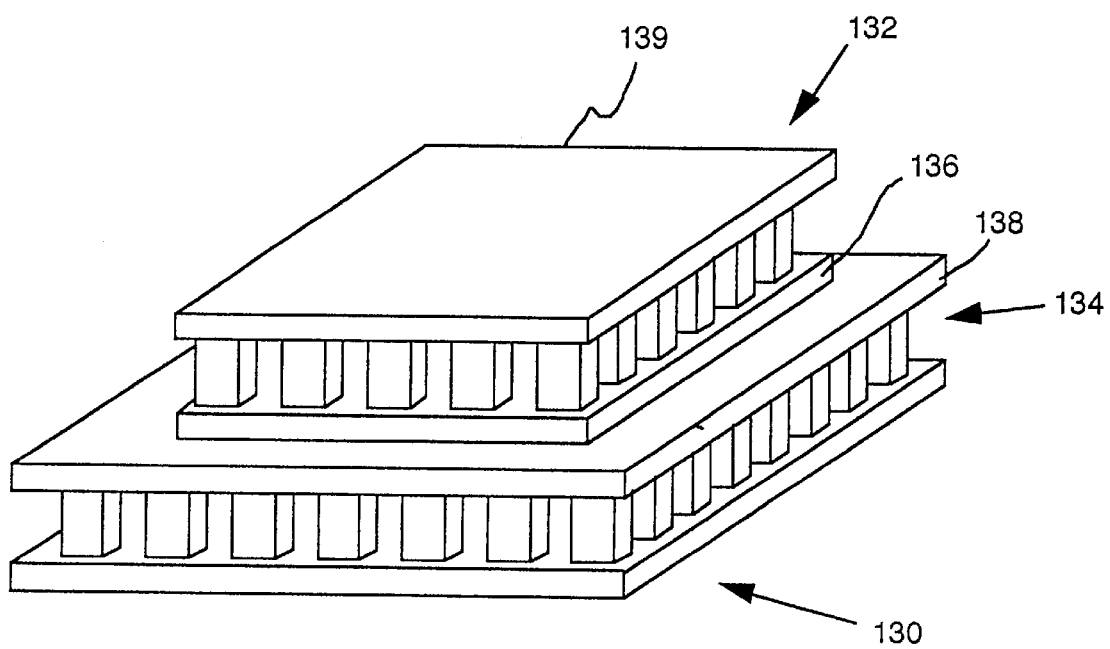
FIG. 6 is a perspective view of another embodiment for the preferred structural component of the present invention.

Referring now to FIG. 6, an assembly 130 is illustrated as another embodiment of the preferred structural component for the present invention wherein a plurality of TE devices are placed in thermal series. The cascaded configuration of two TE devices 132 and 134 are preferably arranged such that a cold face as at 136 of one TE device 132 is in contact with the hot face 138 of a next adjoining TE device, causing the temperature gradient of the outermost hot face 139 to be increased above the capability of a single TE device alone. The contacting faces 136 and 138 of the TE devices 132 and 134 can be mutually adhered by means of thermally-conductive gels, epoxies, or cements. Custom fabrication of a single TE module having such a stacked geometry is possible by placing interconnecting circuitry on both sides of an intermediate ceramic wafer (not shown) so that the semi-conductor blocks of each TE device module can be soldered to both sides of this intermediate wafer. Such sandwiched TE device assemblies can be used in place of a single TE device within the present invention to achieve more extreme temperatures in both cooling and warming compartments.

Figure 7:
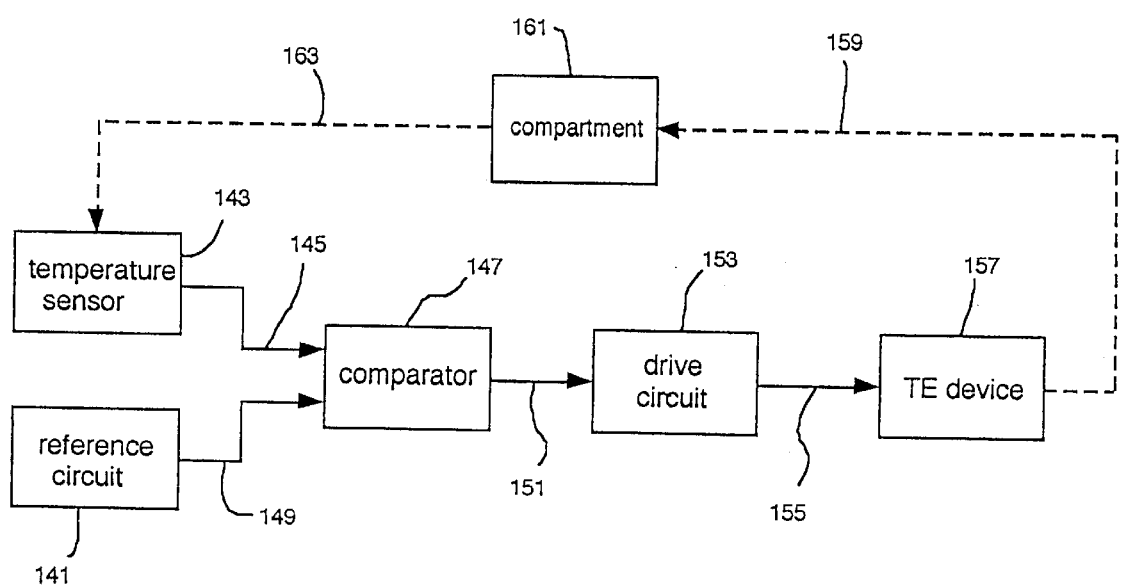
FIG. 7 is a schematic representation of a temperature control assembly defining yet another embodiment of the present invention.

Referring now to FIG. 7, a functional block diagram of a typical feedback control scheme for maintaining compartment temperature is illustrated. In such an embodiment of the invention, a temperature sensor 143, such as a thermistor, is preferably disposed in the compartment 161 that is to be temperature-controlled. The temperature sensor output 145 is an electrical signal, that for the purpose of discussion, is assumed to be a voltage level but, can be a current level. Reference circuit 141 provides a reference voltage 149 indicative of the desired temperature for compartment 161. The reference circuit 141 can provide either a fixed voltage, or various voltage levels corresponding to user selectable temperature settings. Electronic comparator 147 provides an electronic signal 151 to drive circuit 153 that either increases or decreases current to the TE device 157 depending on whether the temperature sensor output 145 is indicative of a compartment temperature below or above the desired temperature set by the reference circuit 141. In the case of warming, heat represented by path 159, is emanated by the TE device into compartment 161 and a small portion of this heat, represented by path 163, induces a response in temperature sensor 143. Circuit time constants must be designed to achieve stability, as with all closed-loop feedback systems. Such feedback control of TE devices may include analog or digital electronic circuits to implement control of TE devices of the type utilized in the various embodiments of the present invention. Further, in addition to the continuous type of control set forth herein, various other types of feedback control devices, such as but not limited to, bang-bang servo, and fuzzy logic devices are within the intended scope of the present invention. Such control can be applied to a single compartment, multiple compartments separately, or multiple compartments jointly.

A convenient means of establishing temperature control about a set point is to design the drive circuit 153 to send bipolar current pulses to the TE device 157. This provides a "small signal" variation, or dithering, of the TE device current about the large positive or negative value that corresponds to current used by the device to either heat or cool. Further, in an embodiment of the present invention in which compartment 161 is designed to be warmed or cooled, the electronic circuitry can have provision for reversing the current through the TE device to alternately achieve a warming or cooling mode. Further, it is possible to establish different stable temperatures in different compartments using separate control circuits for these compartments.

Figure 8:
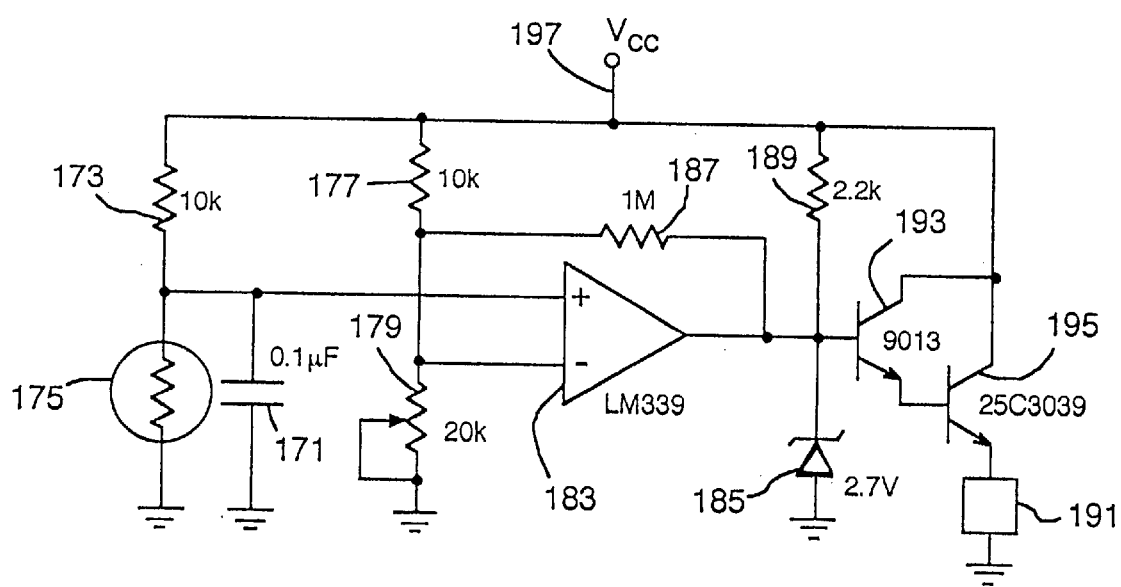
FIG. 8 is circuit diagram representative of one portion of the embodiment of FIG. 7.

A typical electronic circuit implementation for control of a TE device for cooling is provided in FIG. 8 from the reference: H. P. Uranus and I. P. Januar, "Low-Cost Laser-Diode Driver," Electronic Design, pp. 114, Jul. 22, 1996. Other circuits could be used, and the circuit of FIG. 8 is a representative sample. The TE control circuit is a feedback system based on comparator 183. Temperature is sensed by thermistor 175 and capacitor 171 minimizes any sensor noise. Resistor 173 and thermistor 175 provide a voltage divider that establishes the sensor voltage at the non-inverting input of comparator 183. Resistors 177 and 179 form a voltage divider that establishes the reference voltage at the inverting input of comparator 183. The supply voltage is delivered at terminal 197. The desired temperature is set by variable resistor 179. If the sensed temperature is higher than the set point, the voltage at the comparator's inverting input will be below its lower trip point, causing the comparator output to be high and driving the TE device 191 through resistor 189, and transistors 193 and 195. Resistor 187 provides feedback stabilization for comparator 183. The TE device 191 drive current is limited by zener diode 185. When the TE device 191 is driven on, it effects cooling of the compartment to which it is attached. This increases the voltage of the inverting output until it passes the comparator's upper trip point and turns off the TE device drive current.

Since many modifications, variations and changes in detail can be made to the described preferred embodiment of the invention, it is intended that all matters in the foregoing description and shown in the accompanying drawings be interpreted as illustrative and not in a limiting sense. Thus, the scope of the invention should be determined by the appended claims and their legal equivalents.

Now that the invention has been described,
What is claimed is:

1. A heating and cooling assembly designed to heat and cool a variety of objects and substances utilizing thermoelectric heat transfer technology, said assembly comprising:
   a) at least two compartments each having a hollow interior structured to receive an object therein,
   b) at least one heat transferring thermoelectric device disposed in interconnecting, heat conducting relation with said two compartments,
   c) a power supply electrically connected to said one thermoelectric device and structured to selectively deliver activating current thereto,
   d) said thermoelectric device comprising two faces each disposed in heat conductive interconnection with a different one of said two compartments,
   e) said thermoelectric device structured to transfer heat from said interior of one of said two compartments to said interior of the other of said two compartments, and
   f) wherein a temperature of said interior of one of said two compartments is lowered concurrently with a temperature of said interior of the other said two compartments being raised.

2. An assembly as recited in claim 1 further comprising a portable, substantially self contained housing structured to substantially enclose said two compartments and including insulation material disposed within said housing and structured to substantially thermally isolate said two compartments from ambient temperatures exterior of said housing.

3. A heating and cooling assembly designed to heat and cool a variety of objects and substances utilizing thermoelectric heat transfer technology, said assembly comprising:
   a) at least two compartments each having a hollow interior structured to receive an object therein,
   b) at leas t one heat transferring thermoelectric device disposed in interconnecting, heat conducting relation with said two compartments,
   c) a power supply electrically connected to said one thermoelectric device and structured to selectively deliver activating current thereto,
   d) said thermoelectric device comprising two faces each disposed in heat conductive interconnection with a different one of said compartments and a plurality of adjacently disposed P and N doped semi-conductors electrically connected bet ween said two faces,
   e) said thermoelectric device structured to transfer heat from said interior of one of said two compartments upon electrical activation thereof,
   f) each of said interiors of said two compartments further comprising a liner structure formed of thermally conductive material and being dimensioned and configured to maintain direct heat transferring engagement with an object disposed therein,
   g) a portable, substantially self contained housing structured to substantially enclose said two compartments and said power supply therein and further including insulation material disposed therein and structured to substantially thermally isolate said compartments from ambient temperatures exterior of said housing, and h) wherein a temperature of said interior of one of said two compartments is lowered concurrently with a temperature of said interior of the other of said two compartments being raised.

4. A heating and cooling assembly designed to heat and cool a variety of objects and substances utilizing thermoelectric heat transfer technology, said assembly comprising:

a) a plurality of compartments defined by at least two compartment pairs, each compartment pair including two compartments each having a liner structure formed of a thermally conductive material disposed in surrounding relation to a hollow interior thereof, b) said two compartments of each compartment pair interconnected in heat transferring relation to one another by a separate thermoelectric device, c) a power supply electrically connected to each of said thermoelectric devices for selective delivery of actuating current thereto, d) each thermoelectric device comprising two faces, each of said two faces disposed in heat conductive interconnection with a different one of said two compartments of each compartment pair, e) said thermoelectric device structured to transfer heat from said interior of one of said two compartments to the other of said two compartments of each compartment pair upon electrical activation thereof, and f) wherein a temperature of said interior of one of said two compartments of each compartment pair is lowered concurrently with a temperature of said interior of the other of said two compartments being raised.

5. A heating and cooling assembly designed to heat and cool a variety of objects and substances utilizing thermoelectric heat transfer technology, said assembly comprising:

a) a first plurality of compartments and a second plurality of compartments, each compartment comprising a thermally conductive liner structure disposed in substantially surrounding relation to a hollow interior thereof and structured to receive an object therein, b) said line r structures of said first plurality of compartments connected together at points of common thermal contact and said liner structures of said second plurality of compartments connected together at points of common thermal contact, c) at least one heat transferring thermoelectric device thermally interconnecting said first plurality of compartments with said second plurality of compartments, d) a power supply electrically connected to said one thermoelectric device and structured to selectively deliver activating current thereto, e) said thermoelectric device comprising two faces each disposed in heat conductive interconnection with a different one of said first plurality of compartments and said second plurality of compartments, f) said thermoelectric device structured to transfer heat from said interior of at least one of said first plurality of compartments to said interior of at least one of said second plurality of compartments upon electrical activation of said thermoelectric device, and g) wherein a temperature of said interiors of one of said first or second plurality of compartments is lowered concurrently with a temperature of said interiors of the other of said first or second plurality of compartments being raised.

6. An assembly designed to heat or cool a variety of objects utilizing thermoelectric heat transfer technology, said assembly comprising:

a) a t least one compartment including a thermally conductive liner at least partially defining a hollow interior configured to receive an object therein, b) a thermal reservoir disposed in interconnecting relation to said one compartment and structured to have heat transferred thereto from said one compartment or therefrom to said one compartment, c) said thermal reservoir comprising a chamber formed of a thermally conductive material and structured to contain a fluid therein, d) at leas t one thermoelectric device disposed in thermal contact and heat transferring relation between said liner and said thermal reservoir, e) a power supply electrically connected to said one thermoelectric device and structured to selectively deliver activating current thereto, f) said one thermoelectric device comprising two faces each disposed in heat conductive interconnection with a different one of said one compartment and said thermal reservoir, g) said one thermoelectric device structured to selectively transfer heat to or from said hollow interior upon activation of said power supply, and h) wherein a temperature within said hollow interior of said one compartment is raised or lowered concurrently with the lowering or raising respectively of the temperature of the fluid within said chamber.

7. An assembly as in claim 3 Wherein said liner structure of each of said two compartments is dimensioned and configured to receive and maintain thermal contact with like objects, each of the objects defined by a container formed of thermally conductive material and at least partially filled with a liquid.

8. An assembly as in claim 3 wherein said thermoelectric device further comprises two heat exchange members each formed of thermally conductive material and mounted in confronting engagement with a different one of said first and second faces and said liner structures of a different one of said two compartments.

9. An assembly as in claim 8 wherein each of said heat exchange structures are disposed and structured to define a thermal path of heat energy between each of said interiors of said two compartments and respectively positioned ones of said first and second faces of said one thermoelectric device.

10. An assembly as in claim 1 wherein one of said two compartments further defines a heat reservoir disposed and cooperatively structured with said one thermoelectric device to have heat transferred thereto or therefrom absent an object within said interior thereof for selective cooling or heating of the other of said two compartments.

11. An assembly as in claim 5 wherein one of said first and second plurality of compartments define multiple warming compartments and the other of said first and second plurality of compartments defines multiple cooling compartments upon electrical activation of said at least one thermoelectric device by said power supply.

12. An assembly as in claim 11 wherein said points of common thermal contact are each defined by the connecting member formed of thermally conductive material disposed in thermal contact with said liner structures of respective, interconnected ones of said first and second plurality of compartments.

13. An assembly as in claim 1 further comprising at least two thermoelectric devices each including an outer face and an inner face and a plurality of adjacently disposed P and N doped semi-conductors electrically connected therebetween;

said inner faces of each thermoelectric device connected in thermal contact with one another and said outer faces thereof each connected in thermal contact with a different one of said two compartments.

14. An assembly as in claim 1 wherein said power supply comprises a solar power cell array.

15. An assembly as in claim 1 wherein said power supply comprises at least one battery electrically interconnected and structured to be rechargeable.

16. An assembly as in claim 1 further comprising a temperature control assembly including a temperature sensor disposed in heat conductive relation to said interior of at least one of said two compartments, control circuitry electrically connected to said temperature sensor and said power supply and structured to regulate current flow to said thermoelectric device for selective activation thereof to increase or decrease temperature within said one compartment.

17. An assembly as in claim 16 wherein said control circuitry comprises a reference component and a comparator component cooperatively structured to generate a plurality of activating signals to said power supply for activation and deactivation thereof, said plurality of activating signals corresponding to user selectable temperature settings for said one compartment.

18. An assembly as in claim 6 comprising at least two thermoelectric devices each comprising an outer face and an inner face and a plurality of adjacently disposed P and N doped semi-conductors electrically connected therebetween;

said inner face of each thermoelectric device connected in thermal contact with one another and said outer face thereof each connected in thermal contact with a different one of said thermal reservoir and said liner structure.

* * * * *